United States Patent [19]
Mimura et al.

[11] Patent Number: 5,805,865
[45] Date of Patent: Sep. 8, 1998

[54] SEMICONDUCTOR DEVICE

[75] Inventors: Tadaaki Mimura; Takayuki Yoshida; Ichiro Yamane, all of Osaka; Takio Yamashita; Toshio Matsuki, both of Kyoto; Yoshiaki Kasuga, Shiga; Hiroaki Fujimoto, Osaka, all of Japan

[73] Assignee: Matsushita Electric Industrial Co., Ltd., Osaka, Japan

[21] Appl. No.: 721,390

[22] Filed: Sep. 26, 1996

[30]  Foreign Application Priority Data

Sep. 28, 1995 [JP] Japan ................................. 7-251152
May 10, 1996 [JP] Japan ................................. 8-116138

[51] Int. Cl.⁶ ............................. H01L 27/00; G06F 13/00
[52] U.S. Cl. ........................... 395/500; 364/490; 364/489
[58] Field of Search .................................. 364/488, 489, 364/490, 578; 395/500

[56]  References Cited

U.S. PATENT DOCUMENTS

| | | | |
|---|---|---|---|
| 4,783,690 | 11/1988 | Walden et al. ......................... | 357/23.4 |
| 4,811,082 | 3/1989 | Jacobs et al. ............................. | 357/80 |
| 4,901,259 | 2/1990 | Watkins .................................. | 364/578 |
| 5,546,562 | 8/1996 | Patel ....................................... | 395/500 |
| 5,604,888 | 2/1997 | Kiani-Shabestari et al. ........... | 395/500 |

*Primary Examiner*—Vincent N. Trans
*Attorney, Agent, or Firm*—McDermott, Will & Emery

[57]  ABSTRACT

A microcomputer chip is formed with a CPU core, a peripheral circuit, a built-in ROM, and a built-in RAM. An emulation functional chip is formed with an emulation control circuit for controlling the whole process of emulation. First electrode pads formed on the functional surface of the microcomputer chip are electrically interconnected to second electrode pads formed on the functional surface of the emulation functional chip with connecting bumps interposed therebetween. The microcomputer chip and the emulation functional chip are modularized using an insulating resin with the first electrode pads being connected to the second electrode pads.

14 Claims, 24 Drawing Sheets

5,805,865

SEMICONDUCTOR DEVICE

BACKGROUND OF THE INVENTION

The present invention relates to semiconductor devices and, more particularly, to a semiconductor device composed of a microcomputer having an in-circuit emulating (ICE) function or an OTP (One-Time Programmable) microcomputer, each of which is a program development tool, and to a semiconductor device composed of a semiconductor chip mounted on a different semiconductor chip or circuit board by face-down bonding.

In developing a microcomputer (microcomputer for built-in control), there has conventionally been used an emulator or OPT microcomputer to develop a user program for control.

The development of a microcomputer involves hardware development achieved by a semiconductor producer by incorporating a user circuit as a peripheral circuit into the microcomputer in response to user demands and program development (software development) achieved by a user.

To develop software, the user needs an emulator (in-circuit emulator) in combination with a debugger, an assembler/linker, a software simulator, and the like. These elements are supplied as microcomputer development tools from the semiconductor producer to the user. With a microcomputer for built-in equipment, in particular, it is necessary to verify interrupt processing or the like in real time, so that an emulator is indispensable.

With the emulator, the user debugs a program, while operating the microcomputer, to complete the user program. Thereafter, the semiconductor producer writes the completed user program in a mask ROM, thereby finishing a final microcomputer for mass production.

As described above, the emulator is used to debug the user program and verify operations of the microcomputer and built-in equipment before the microcomputer chip having final specifications for mass production with the built-in user program is finished.

Below, a description will be given to an emulator as a semiconductor device according to a first conventional embodiment with reference to FIG. 19.

The emulator typically comprises: a CPU core (main body of a microcomputer) 10; a user logic (peripheral circuit) 11; a microcomputer chip (evaluation chip) 15 with a built-in RAM 12 and a built-in first control circuit 13A for controlling the emulating operation; and an emulation functional chip 20 with a built-in second control circuit 13B for controlling the emulating operation, a built-in emulation memory 17, and a built-in trace memory 18. The microcomputer chip 15 is mounted on a module substrate 21 termed POD and connected directly to a socket on a user system board. The emulation functional chip 20 and the module substrate 21 are connected to each other by a cable 22 (flat cable with a length of several tens of centimeters) so that data transfer is frequently performed between the emulation functional chip 20 and the microcomputer chip 15 through the cable 22 during the operation of the emulator. When the operating speed of the microcomputer is increased, however, errors occur during the data transfer due to the length of the cable 22.

To prevent the errors, there has been proposed a microcomputer chip internally provided with the emulating function. Below, a description will be given to a microcomputer chip 30 according to a second conventional embodiment with reference to FIG. 20.

The microcomputer chip 30 according to the second conventional embodiment comprises: a CPU core 31; a user logic (peripheral circuit) 32; a built-in RAM 33; an emulation control circuit 34; a trace memory 35; a memory 36 for monitoring debugging; and an emulation memory 37. The microcomputer chip 30 is internally provided with the emulating function to reduce a difference in electric operating characteristic between the emulation functional chip and an actual microcomputer chip (actual chip) and improve the real-time property of debugging such as interrupt processing. Since the second conventional embodiment does not require the cable 22 for connecting the emulation functional chip 20 to the microcomputer chip 15, errors occurring during the data transfer can be prevented.

Next, a description will be given to a microcomputer 40 with a built-in OTP according to a third conventional embodiment with reference to FIG. 21. The microcomputer 40 with a built-in OTP is internally provided with: a CPU core 41; a peripheral circuit 42; and an OTP memory 43 (such as a UV erasable programmable ROM or an electrically erasable programmable ROM) and is developed for each item of microcomputers.

Below, a description will be given to a semiconductor device on which a semiconductor chip is mounted by flip-chip bonding according to a fourth conventional embodiment with reference to FIGS. 22 to 24.

Flip-chip bonding whereby a bare semiconductor chip is mounted on another semiconductor chip or on a circuit board in accordance with a face-down method without hermetically sealing the semiconductor chip in such a package as a PGA (Pin Grid Array) or QFP (Quad Flat Gull Wing Leaded Package) is extremely effective in providing miniaturized and lighter-weight electronic equipment. Known electrode pads for use in flip-chip bonding includes a peripheral type disposed on the peripheral portion of the semiconductor chip and an area type disposed on the central portion of the semiconductor chip. Of the two types, the area type is advantageous for the tendency to provide an increasing number of pins, since area-type electrode pads can be arranged over substantially the entire area of the semiconductor chip.

FIG. 22 shows the cross-sectional structure of the semiconductor device according to the fourth conventional embodiment composed of a semiconductor chip 51 mounted on a circuit board 52 by flip-chip bonding. FIG. 23 shows the plan structure of the semiconductor chip 51 of the semiconductor device according to the fourth conventional embodiment.

As shown in FIG. 22, electrode pads 53 formed on the semiconductor chip 51 are electrically connected to electrode pads 54 formed on the circuit board 52 with connecting bumps 55 interposed therebetween. The semiconductor chip 51 is secured to the circuit board 52 by using an insulating resin 56 with the area electrode pads 53 connected to the electrode pads 54. As shown in FIG. 23, the area electrode pads 53 are formed dispersedly in the central portion of the semiconductor chip 51.

FIG. 24 shows the cross-sectional structure of the semiconductor chip 51 of the semiconductor device according to the fourth conventional embodiment. On a diffused region 60 of a transistor formed in a semiconductor substrate, there is formed a first-layer interconnection 61. The first-layer interconnection 61 is connected to a second-layer interconnection 62 by a first contact 63. The second-layer interconnection 62 is connected to a third-layer interconnection 64 by a second contact 65. The third-layer interconnection 64 is connected to a pad withdrawn interconnection 66 in the uppermost layer by a third contact 67.

On the area electrode pads 53 connected to the pad withdrawn interconnection 66 in the uppermost layer, there are formed the connecting bumps 55. Since the area electrode pads 53 with about 200- to 250-μm pitches occupy a large area, the withdrawn interconnection 66 connected to the area electrode pads 53 is formed in the uppermost layer. In short, the uppermost layer serves as a layer dedicated to the withdrawn interconnection 66 connected to the first area electrode pads 53. The arrangement allows the area electrode pads 53 to be formed over substantially the entire surface of the semiconductor chip 51.

The connecting bump 55 is composed of solder such as Pb/Sn, while the circuit board 52 is composed of a ceramic or glass epoxy. The semiconductor chip 51 is mounted on the circuit board 52 by flip-chip bonding in accordance with the following procedures: After the connecting bumps 55 of the semiconductor chip 51 are aligned with the electrode pads 54 of the circuit board 52, the semiconductor chip 51 is mounted on the circuit board 52. During the process, the semiconductor chip 51 is heated and pressed against the circuit board 52 so as to provide contact between the connecting bumps 55 and the electrode pads 54 of the circuit board 52. Thereafter, the circuit board 52 with the semiconductor chip 51 mounted thereon is heated to melt the connecting bumps 55 and thereby establish electric connections between the connecting bumps 55 and the electrode pads 54.

In the emulator according to the first conventional embodiment, however, the microcomputer chip 15 and the emulation functional chip 20 are mounted on different circuit boards and connected to each other by the cable 22 having a given length, as described above, so that a signal delay or distortion of the waveform occurs during the data transfer between the microcomputer chip 15 and the emulation functional chip 20, which limits the operating frequency of the emulator. In a microcomputer operating at a high speed of 100 MHz or more, therefore, debugging by means of the emulator according to the first conventional embodiment becomes difficult.

Although the problems presented by the first conventional embodiment are reduced by the second conventional embodiment using the microcomputer chip 30 internally provided with the emulating function which considerably improves the real-time property and electric characteristic, the second conventional embodiment requires the development of the microcomputer chip 30 internally provided with the emulating function for each item of microcomputers, so that the number of developing steps is increased disadvantageously as more items of microcomputers are produced.

The third conventional embodiment also requires the development of the microcomputer 40 with a built-in OTP for each item of microcomputers, since the microcomputer 40 has the built-in OTP memory 43. Moreover, since the CPU core 41 and the peripheral circuit 42 are formed by a microcomputer fabrication process (CMOS fabrication process), while the OTP memory 43 is formed by an OTP fabrication process, the development of the OTP fabrication process as well as the development of the microcomputer fabrication process becomes necessary as the generation of microcomputers proceeds. As a result, the period required for development is extended disadvantageously as the number of developing steps is increased.

The fourth conventional embodiment also requires a dedicated layer in which the area electrode pads 53 are formed in addition to the first to third interconnections 61, 62, and 64 required to form a functional element in the semiconductor chip 51. Briefly, a total of four layers including three interconnection layers in which the first to third interconnections 61, 62, and 64 are formed and a layer dedicated to the pads become necessary. In a semiconductor device having area-type electrode pads, therefore, extra process cost of forming the area electrode pads in the dedicated layer becomes necessary, while the production yield is reduced inevitably with the increase in the number of interconnection layers, resulting in increased final chip cost. Furthermore, since the pad withdrawn interconnection 66 is routed from an input/output point in the functional element to the area electrode pads 53, a load on interconnecting wires may prevent the semiconductor device from operating at a high speed.

SUMMARY OF THE INVENTION

In view of the foregoing, a first object of the present invention is to provide a high-performance, high-speed semiconductor device composed of a microcomputer with a built-in emulator or OTP. A second object of the present invention is to reduce the chip cost of a semiconductor device having area-type electrode pads and a load on the interconnecting wires provided therein.

To attain the above first object, a first semiconductor device according to the present invention comprises: a first semiconductor chip composed of a microcomputer chip having a CPU core, a peripheral circuit, and a built-in RAM and not having an emulation functional element; and a second semiconductor chip occupying a larger area than the first semiconductor chip and having the emulation functional element, wherein electrode pads of the first semiconductor chip are electrically connected to electrode pads of the second semiconductor chip with bumps interposed therebetween.

In the first semiconductor device, the electrode pads of the first semiconductor chip composed of the microcomputer chip having the CPU core, the peripheral circuit, and the built-in RAM are connected to the electrode pads of the second semiconductor chip having the emulation functional element with the bumps interposed therebetween, so that the distance between the CPU core in the microcomputer chip of the first semiconductor chip and the emulation functional element of the second semiconductor chip is reduced. Consequently, the influence of a signal delay or noise is reduced, which enables emulation at a high speed of 100 MHz or more in real time.

Moreover, since the first semiconductor chip composed of the microcomputer chip having the CPU core and the second semiconductor chip having the emulation functional element are formed separately, it is sufficient to replace the microcomputer chip formed with the CPU core with another when a different item of microcomputers are developed so that the same second semiconductor chip having the emulation functional element can be used. Consequently, the microcomputer chip initially developed can be used for mass production, so that the number of steps for developing the microcomputer chip and the development cost can be reduced significantly.

To attain the above first object, a second semiconductor device according to the present invention comprises: a first semiconductor chip composed of a microcomputer chip having a CPU core, a peripheral circuit, and a built-in RAM and not having a non-volatile memory of erasable or writable type; and a second semiconductor chip occupying a larger area than the first semiconductor chip and having the non-volatile memory of erasable or writable type, wherein electrode pads of the first semiconductor chip are electrically connected to electrode pads of the second semiconductor chip with bumps interposed therebetween.

In the second semiconductor device, the electrode pads of the first semiconductor chip composed of the microcomputer chip having the CPU core, the peripheral circuit, and the built-in RAM are connected to the electrode pads of the second semiconductor chip having the non-volatile memory of erasable or writable type with the bumps interposed therebetween. Accordingly, the distance between the CPU core in the microcomputer chip of the first semiconductor chip and the non-volatile memory of erasable or writable type of the second semiconductor chip is reduced, which reduces the influence of a signal delay or noise.

Furthermore, since the first semiconductor chip composed of the microcomputer chip having the CPU core and the second semiconductor chip having the non-volatile memory are formed separately, it is sufficient to replace the microcomputer chip formed with the CPU core with another when a different item of microcomputers are developed so that the same second semiconductor chip having the emulation functional element can be used. Consequently, the microcomputer chip initially developed can be used for mass production, so that the number of steps for developing the microcomputer chip and the development cost can be reduced significantly.

In addition, a derivative process for mounting the non-volatile memory on the microcomputer chip becomes unnecessary, while the CMOS of the CPU core and the non-volatile memory need not use the same design rules, so that the CMOS fabrication process and the non-volatile memory fabrication process do not necessarily belong to the same generation.

To attain the above second object, a third semiconductor device according to the present invention comprises: a first semiconductor chip formed with a first functional element; and a second semiconductor chip formed with a second functional element, wherein the first and second semiconductor chips are disposed with respective functional surfaces formed with the first and second functional elements being opposed to each other, first electrode pads of the first semiconductor chip are electrically connected to second electrode pads of the second semiconductor chip with bumps interposed therebetween, and the first electrode pads are formed on a region formed with the first functional element of the same layer as the uppermost one of interconnection layers composing the first functional element.

In the third semiconductor device, the first electrode pads of the first semiconductor chip are formed in the same layer as the uppermost one of the interconnection layers composing the first functional element, so that a layer dedicated to the interconnecting wires routed for the first electrode pads becomes unnecessary. As a result, the process cost is reduced and the production yield is increased, resulting in a reduction in the cost of manufacturing the semiconductor device.

Moreover, since the first electrode pads of the first semiconductor chip are formed in the same layer as the uppermost one of the interconnection layers composing the first functional element, a load on the interconnecting wires routed for the first electrode pads is reduced. Furthermore, since the first electrode pads are formed on the region formed with the first functional element, the interconnection connecting the first functional element to the first electrode pad is extremely shortened. Consequently, the operating speed of the semiconductor device can be increased.

In the third semiconductor device, the first electrode pads are preferably formed on a peripheral region of a functional block composing the first functional element so as to transmit signals between the functional block and the outside of the first semiconductor chip. In the arrangement, the distance between the functional block and the first electrode pads is extremely reduced, so that capacitance and load resistance are reduced, while the functional block and the first electrode pads can be registered as one design library, which improves the efficiency with which the semiconductor device is designed.

In the third semiconductor device, the first electrode pads are preferably formed on an internal region of a functional block composing the first functional element so as to transmit signals between the functional block and the outside of the first semiconductor chip. In the arrangement, the distance between the functional block and the first electrode pads is extremely reduced, so that capacitance and load resistance are reduced, while the functional block and the first electrode pads can be registered as one design library, which improves the efficiency with which the semiconductor device is designed.

In these cases, it is preferred that the first semiconductor chip is a microcomputer chip and that the functional block is a CPU core. The arrangement increases the operating speed of the CPU core and allows the CPU core and the first electrode pads to be registered as one design library.

In the third semiconductor device, each of the first electrode pads is preferably formed above a signal input/output circuit element composing the first functional element. In the arrangement, the first electrode pads apparently occupy no area and can be registered as pads on the signal input/output circuit element in the design library.

In the third semiconductor device, it is particularly preferred that the first semiconductor chip is a microcomputer chip having a CPU core, a peripheral circuit, and a built-in RAM and not having an emulation functional element and that the second semiconductor chip has the emulation functional element.

In the third semiconductor device, it is particularly preferred that the first semiconductor chip is a microcomputer chip having a CPU core, a peripheral circuit, and a built-in RAM and not having a non-volatile memory of erasable or writable type and that the second semiconductor chip has the non-volatile memory of erasable or writable type.

To attain the above second object, a fourth semiconductor device according to the present invention comprises: a semiconductor chip formed with a functional element; and a circuit board with the semiconductor chip mounted thereon by face-down bonding, wherein first electrode pads of the semiconductor chip are electrically connected to second electrode pads of the circuit board with bumps interposed therebetween and the first electrode pads are formed on a region formed with the functional element of the same layer as the uppermost one of interconnection layers composing the functional element.

In the fourth semiconductor device, the first electrode pads of the semiconductor chip are formed in the same layer as the uppermost one of the interconnection layers composing the functional element, so that the layer dedicated to the interconnection routed for the first electrode pads becomes unnecessary. As a result, the process cost is reduced and the production yield is increased, resulting in a reduction in the cost of manufacturing the semiconductor device.

Moreover, since the first electrode pads of the semiconductor chip are formed in the same layer as the uppermost one of the interconnection layers composing the functional element, a load on the interconnection routed for the first electrode pads is reduced. Furthermore, since the first electrode pads are formed on the region formed with the functional element, the interconnection connecting the functional element to the first electrode pad is extremely shortened. Consequently, the operating speed of the semiconductor device can be increased.

In the fourth semiconductor device, the first electrode pads are preferably formed on a peripheral region of a functional block composing the functional element so as to transmit signals between the functional block and the outside of the first semiconductor chip. In the arrangement, the distance between the functional block and the first electrode pads is extremely reduced, so that capacitance and load resistance are reduced, while the functional block and the first electrode pads can be registered as one design library, which improves the efficiency with which the semiconductor device is designed.

In the fourth semiconductor device, the first electrode pads are preferably formed on an internal region of a functional block composing the first functional element so as to transmit signals between the functional block and the outside of the first semiconductor chip. In the arrangement, the distance between the functional block and the first electrode pads is extremely reduced, so that capacitance and load resistance are reduced, while the functional block and the first electrode pads can be registered as one design library, which improves the efficiency with which the semiconductor device is designed.

In these cases, it is preferred that the first semiconductor chip is a microcomputer chip and that the functional block is a CPU core. The arrangement increases the operating speed of the CPU core and allows the CPU core and the first electrode pads to be registered as one library.

In the fourth semiconductor device, each of the first electrode pads is preferably formed above a signal input/output circuit element composing the first functional element. In the arrangement, the first electrode pads apparently occupy no area and can be registered as pads on the signal input/output circuit element in the design library.

DETAILED DESCRIPTION OF THE INVENTION

Below, semiconductor devices according to the individual embodiments of the present invention will be described with reference to the drawings.

(First Embodiment)

Figure 1:
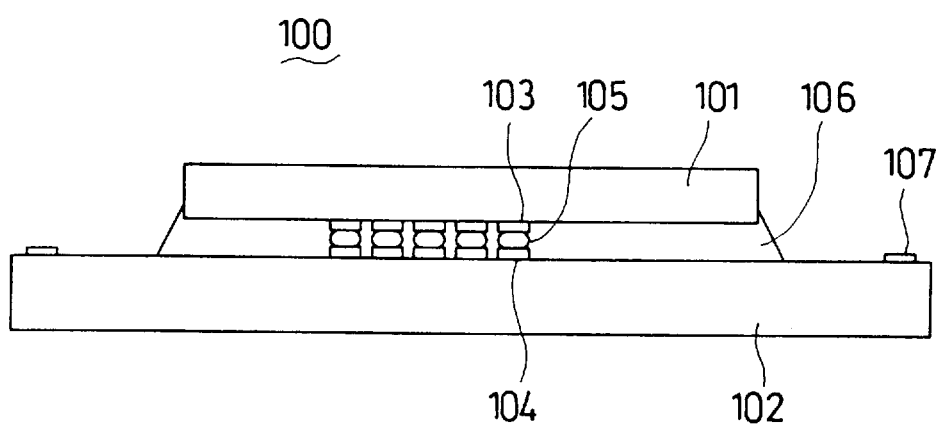
FIG. 1 is a cross-sectional view of an emulator as a semiconductor device according to a first embodiment.

FIG. 1 shows the cross-sectional structure of an emulator 100 as a semiconductor device according to a first embodiment of the present invention. The emulator 100 is composed of a microcomputer chip 101 as a first semiconductor chip and an emulation functional chip 102 as a second semiconductor chip occupying a larger area than the microcomputer chip 101, which have been modularized with their respective functional surfaces (formed with semiconductor elements) opposed to each other.

First electrode pads 103 formed on the functional surface of the microcomputer chip 101 and second electrode pads 104 formed on the functional surface of the emulation functional chip 102 are electrically connected to each other with connecting bumps 105 interposed therebetween. The microcomputer chip 101 is secured to the emulation functional chip 102 by using a photocuring insulating resin 106 with the first electrode pads 103 being connected to the second electrode pads 104. The peripheral portion of the emulation functional chip 102 is formed with an electrode 107 for external connection.

For the connecting bumps 105, solder bumps or metal bumps composed of gold or the like formed by electrolytic or electroless plating may be used.

Figure 2:
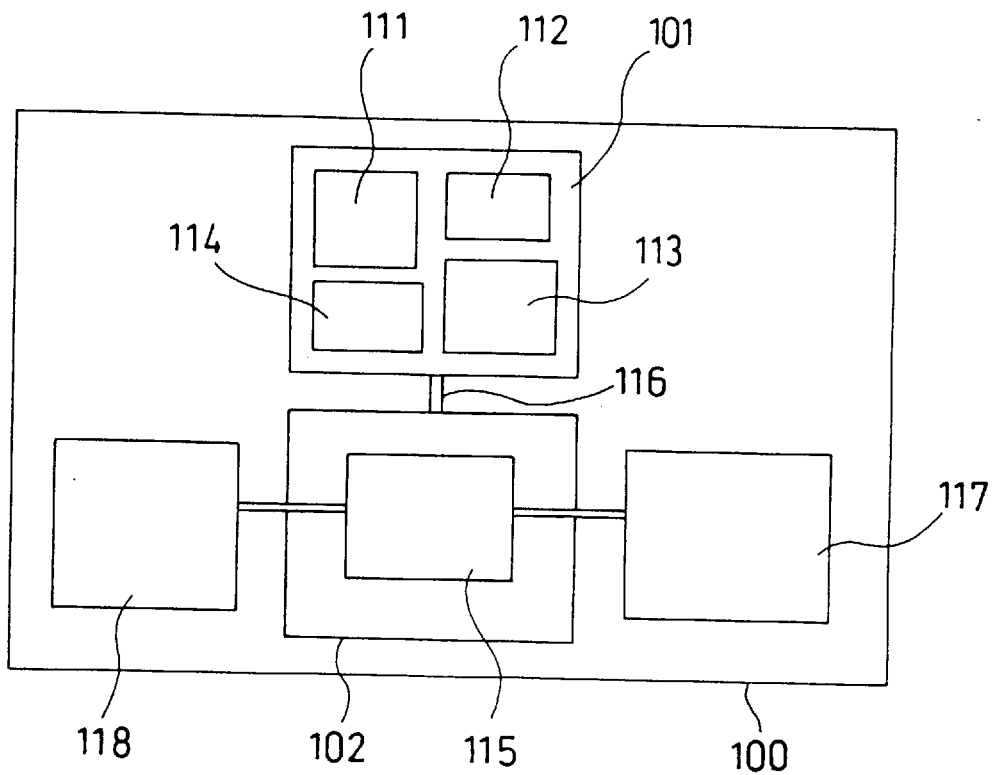
FIG. 2 is a functional block diagram of the emulator in the semiconductor device according to the first embodiment.

FIG. 2 shows functional blocks of the emulator 100. In the microcomputer chip 101, there are formed: a CPU core 111; a peripheral circuit 112; a built-in ROM 113; and a built-in RAM 114. In the emulation functional chip 102, there is formed an emulation control circuit 115 for controlling the whole process of emulation. FIG. 2 also shows: an internal bus 116 for providing connection between the microcomputer chip 101 and the emulation chip 102; an emulation memory 117; and a trace memory 118. These two memories perform the principal function of the emulator.

Figure 3:
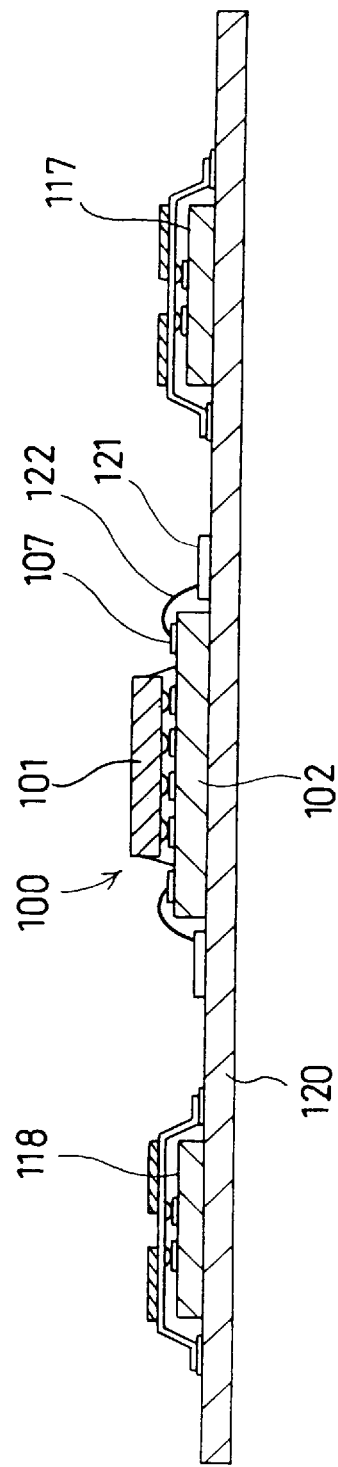
FIG. 3 is a cross-sectional view showing a circuit board on which the emulator in the semiconductor device according to the first embodiment is mounted.
Figure 4:
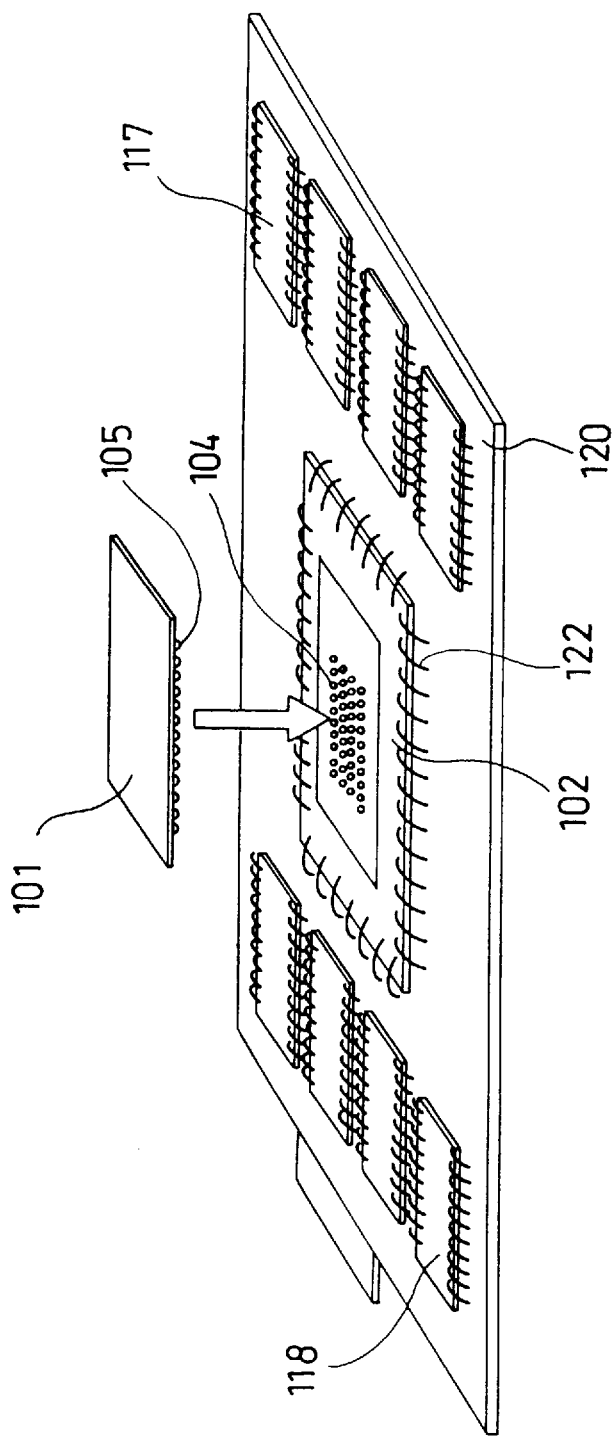
FIG. 4 is a perspective view showing the circuit board on which the emulator in the semiconductor device according to the first embodiment is mounted.

FIGS. 3 and 4 show a circuit board 120 on which the emulator 100 is mounted, of which FIG. 3 is a cross-sectional view thereof and FIG. 4 is a perspective view thereof.

As shown in FIGS. 3 and 4, the emulator 100 composed of the microcomputer chip 101 integrated with the emulation functional chip 102 is mounted on the circuit board 120 composed of a printed circuit board or a ceramic substrate. In this case, the electrode 107 for external connection of the emulation functional chip 102 is electrically connected to the connecting electrode 121 on the circuit board 120 by a bonding wire 122. The emulation memory 117 and the trace memory 118 are also mounted on the circuit board 120 and electrically connected there by wire bonding or TAB (Tape Automated Bonding).

Figure 5:
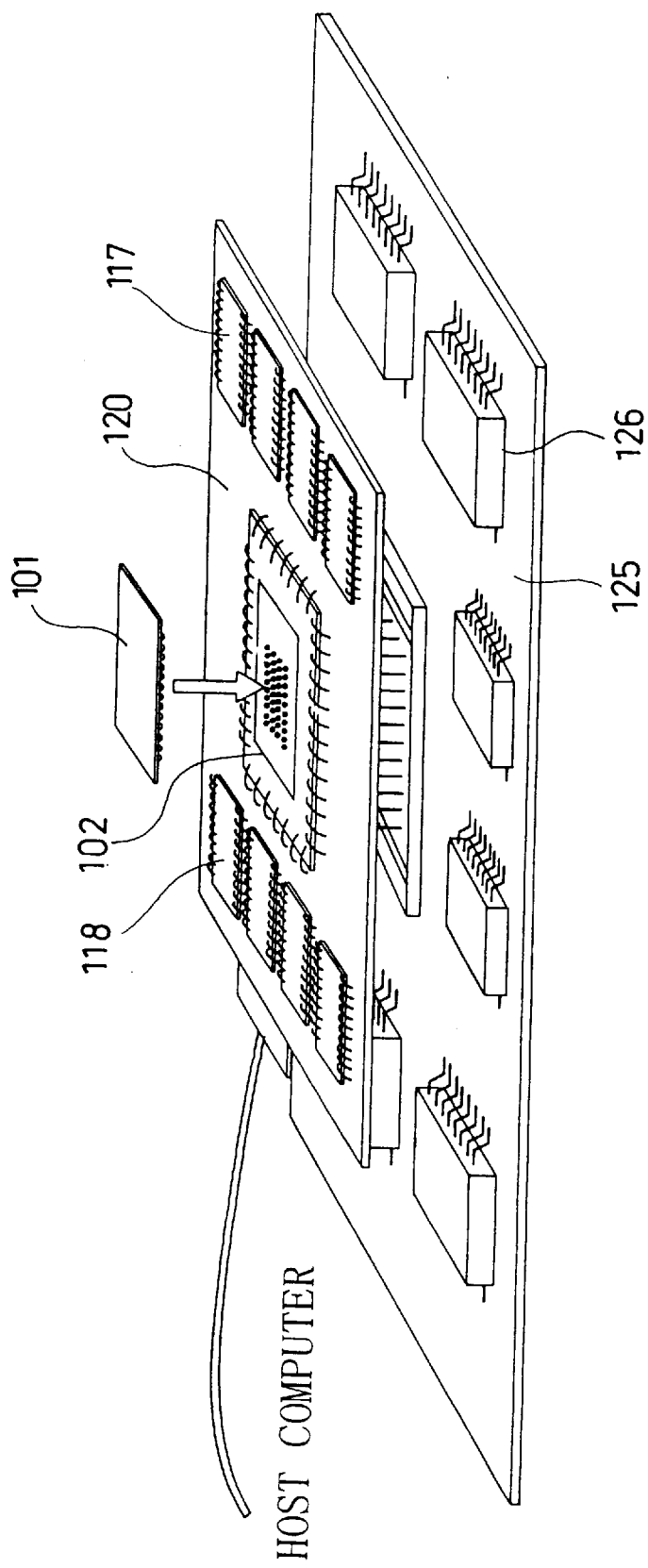
FIG. 5 is a perspective view showing a user board carrying the circuit board on which the emulator in the semiconductor device according to the first embodiment is mounted.

FIG. 5 shows a user board 125 carrying the circuit board 120 on which the emulator, the emulation memory 117, and the trace memory 118 are mounted. On the user board 125, there is mounted a user logic 126 for system equipment with which a user program for operating the microcomputer is debugged while the microcomputer is actually operating.

Figure 19:
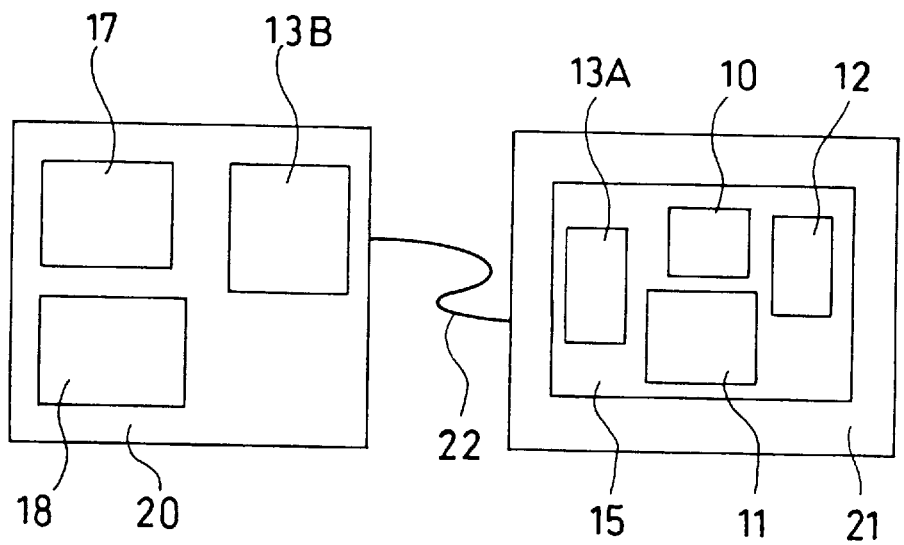
FIG. 19 is a plan view of an emulator as a semiconductor device according to a first conventional embodiment.
Figure 20:
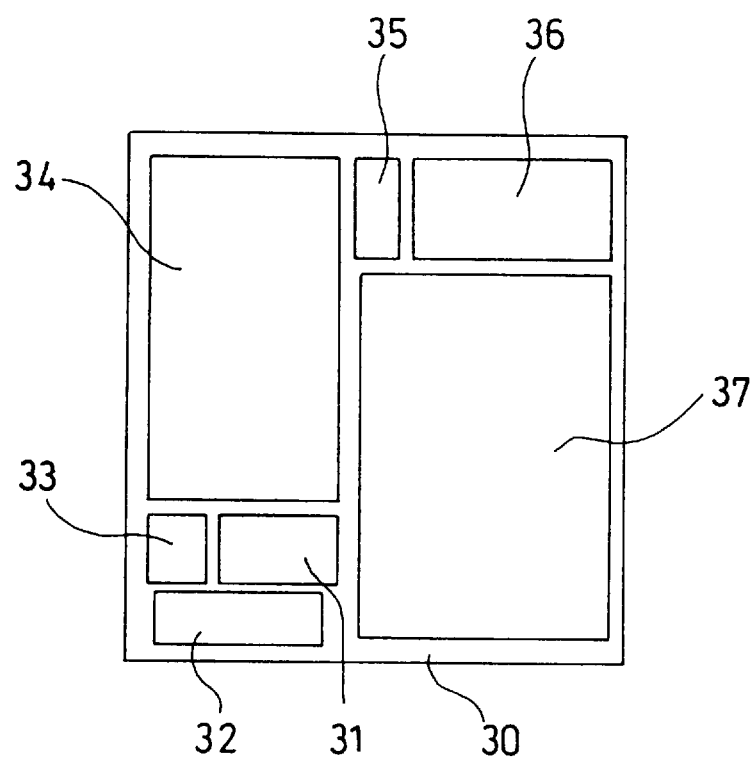
FIG. 20 is a plan view of an emulator as a semiconductor device according to the second conventional embodiment.
Figure 21:
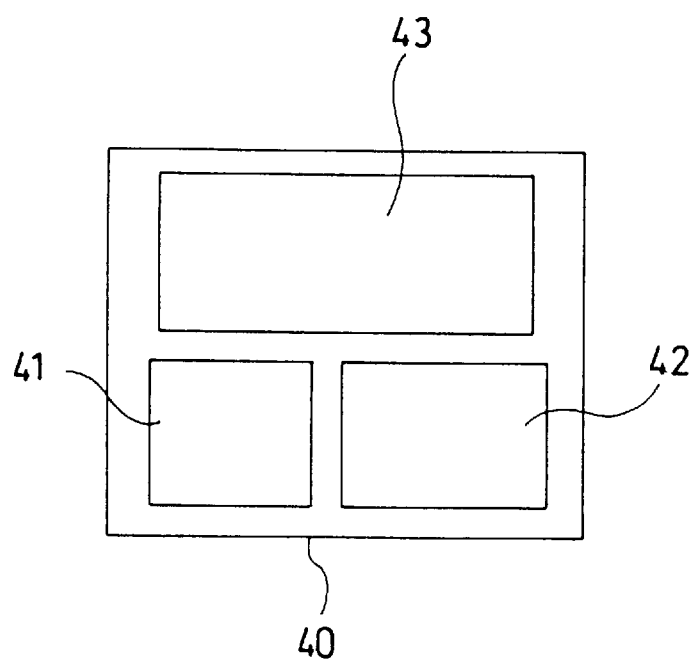
FIG. 21 is a plan view of an OTP microcomputer as a semiconductor device according to a third conventional embodiment.
Figure 22:
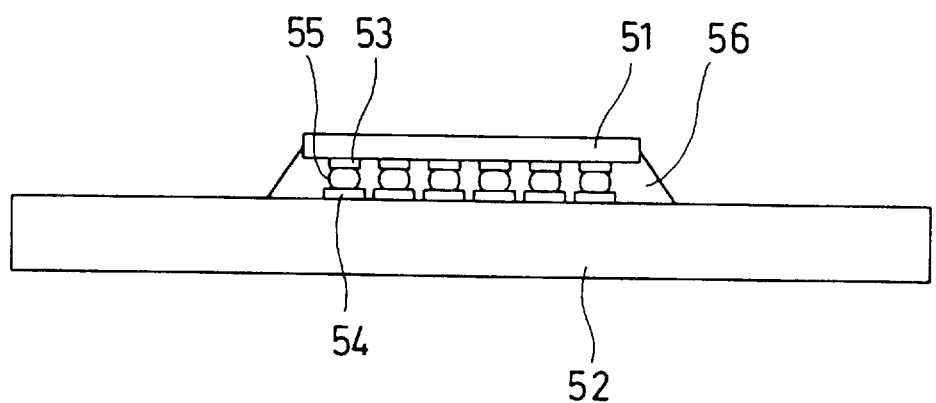
FIG. 22 is a cross-sectional view of a semiconductor device according to a fourth conventional embodiment.
Figure 23:
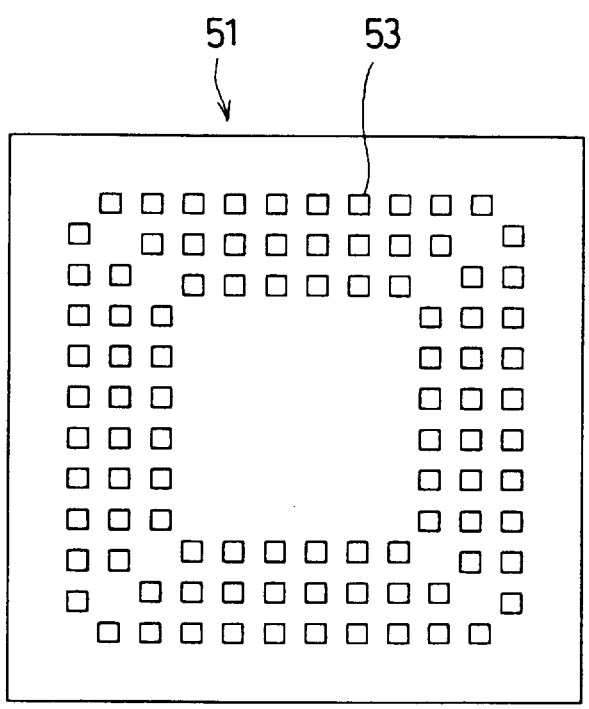
FIG. 23 is a plan view of a semiconductor chip composing the semiconductor device according to the fourth conventional embodiment.
Figure 24:
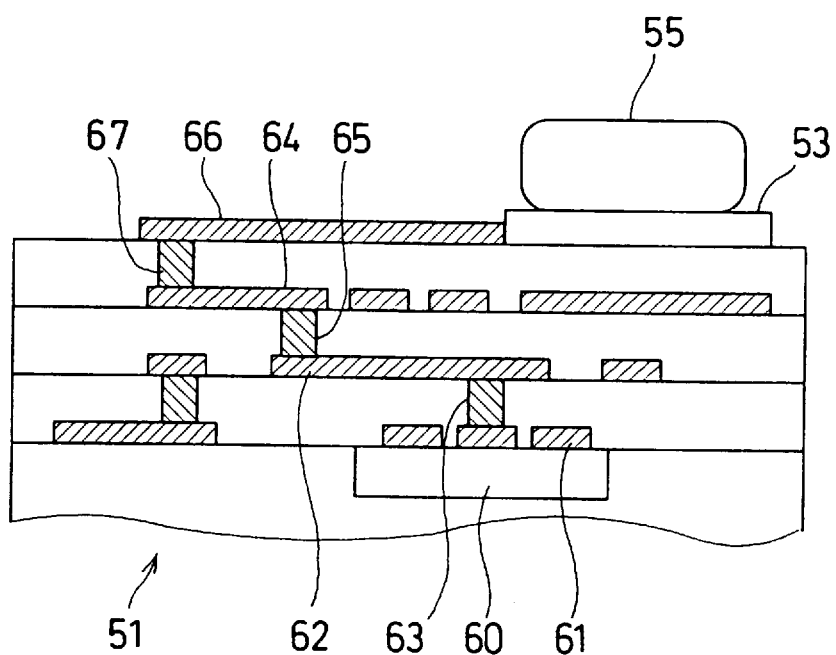
FIG. 24 is a cross-sectional view of the semiconductor chip composing the semiconductor device according to the fourth conventional embodiment.

According to the first conventional embodiment shown in FIG. 19, the CPU core 10 is contained in the microcomputer chip 15 and connected by the cable 20 to the emulation functional chip 20 on which the emulation memory 17 and the trace memory 18 are mounted, resulting in a long distance between the microcomputer chip 15 and the emulation functional chip 20. Moreover, since the circuit for controlling the emulator is divided into the first control circuit 13A formed on the microcomputer chip 15 and the second control circuit 13B formed on the emulation functional chip 20, the operation of the microcomputer which is emulated in real time cannot be ensured due to a delay in signal transmission from the CPU core 10 to the emulation memory 17 when the CPU core 10 operates at a high speed. Consequently, emulation cannot be performed any more in real time. In general, the operation becomes difficult at 50 MHz or higher under the influence of a signal delay or noise in the course of signal transmission.

According to the first embodiment, by contrast, the microcomputer chip 101 formed with the CPU core 111 is connected to the emulation functional chip 102 formed with the emulation memory 117 and the trace memory 118 by the connecting bumps 105, resulting in an extremely short distance between the microcomputer chip 101 and the emulation functional chip 102. Consequently, emulation can be performed even when the CPU core 111 operates at a high speed. In other words, since the CPU core 111 in the microcomputer chip 101, the emulation control circuit 115, the emulation memory 117, and the trace memory 118 are physically in close proximity, they are immune to the influence of the signal delay or noise, which enables emulation in real time. Since the microcomputer chip 101 is connected directly to the emulation functional chip 102 by the connecting bumps 105, a signal delay between the CPU core 111 and the emulation functional chip 102 is remarkably reduced to permit operation at a high speed of 100 MHz or more.

On the other hand, since the microcomputer chip 101 formed with the CPU core 111 and the emulation functional chip 102 formed with the emulation memory 117 and the trace memory 118 are formed separately, it is sufficient to replace the microcomputer chip 101 formed with the CPU core 111 with another in developing an different item of microcomputers. Since the same emulation functional chip 102 can be used, the operation can be verified efficiently. In this case, if the specifications of the first electrode pads 103 (arrangement of pins and physical specifications of the pads) of the microcomputer chip 101 and the specifications of the second electrode pads 104 of the emulation functional chip 102 are standardized, the same emulation functional chip 102 can be used in common by different items of microcomputer chips 101, so that the number of steps for developing an emulator and the developing period can greatly be reduced advantageously, similarly to the first conventional embodiment.

Moreover, since the first embodiment enables the microcomputer chip 101 to have entirely the same layout as that of the final microcomputer chip for mass production except for the built-in RAM for storing the user program, it is not necessary to individually develop the microcomputer chip 15 or 30 internally provided with the emulating function shown in the first or second conventional embodiment. In other words, the emulator can be composed of the microcomputer chip having the layout in accordance with the final specifications for mass production, so that the emulator is judged to be excellent after the operation of the semiconductor device according to the first embodiment is verified. This eliminates the necessity for designing again the layout of the CPU core, the peripheral circuit, and the built-in ROM in mass-producing the microcomputer chip, resulting in a significant reduction in the steps for developing the microcomputer chip.

Figure 6:
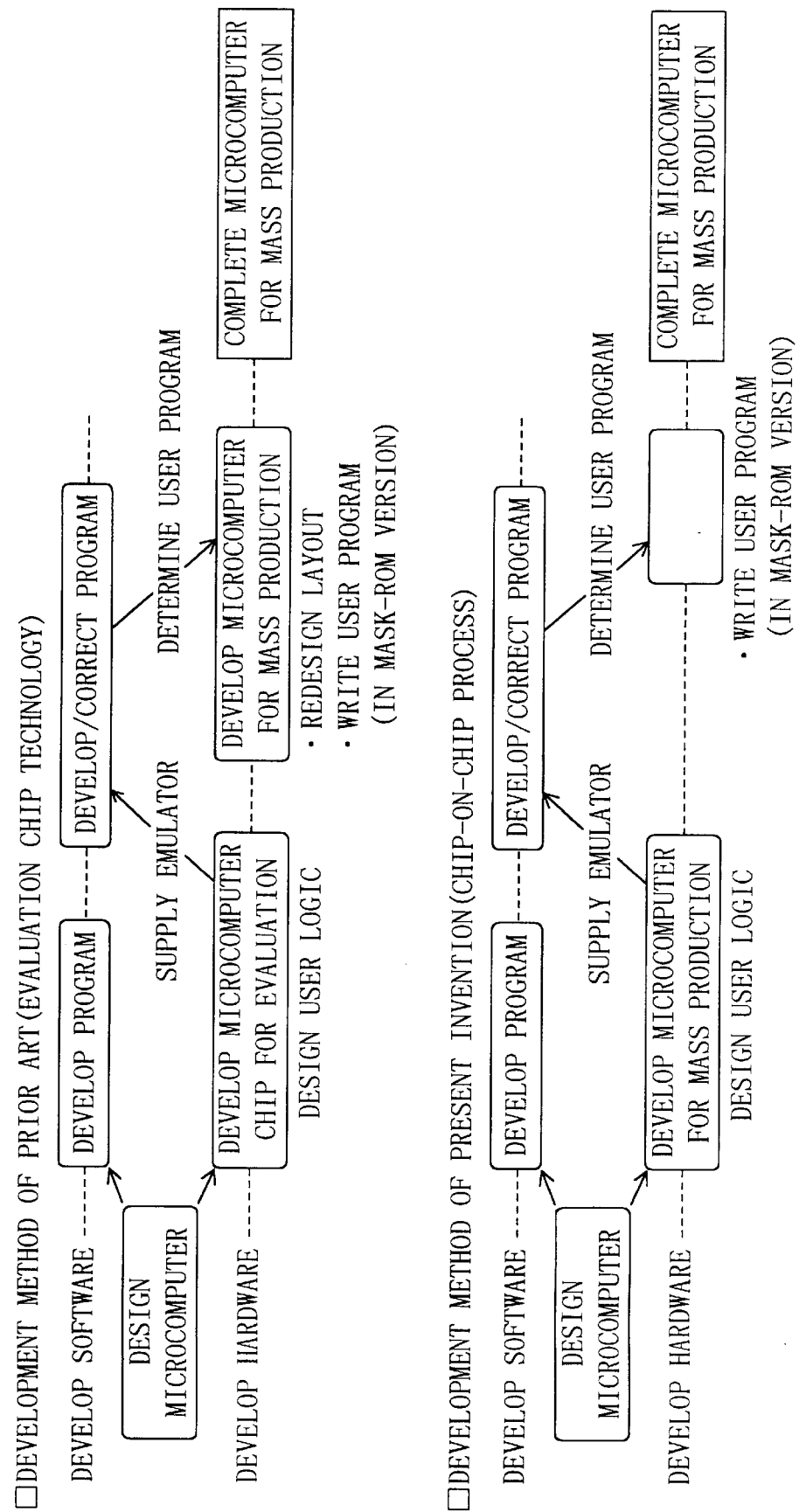
FIG. 6 illustrates for comparison respective flows of developing microcomputers using the emulator of the first embodiment and an emulator of a second conventional embodiment.

FIG. 6 shows for comparison the flow of developing the microcomputer with the emulator by the method according to the second conventional embodiment and the flow of developing the microcomputer with the emulator by the method according to the first embodiment. As is apparent from the foregoing description and from the flow shown in FIG. 6, the conventional development of the microcomputer involves the two discrete steps of developing the microcomputer chip for evaluation and developing the microcomputer chip for mass production. According to the first embodiment, however, the step of developing the microcomputer chip for evaluation can be omitted. Moreover, if an external MASK-ROM is used, the microcomputer for mass production can be finished at the same time as the user program is determined.

(Second Embodiment)

Figure 7:
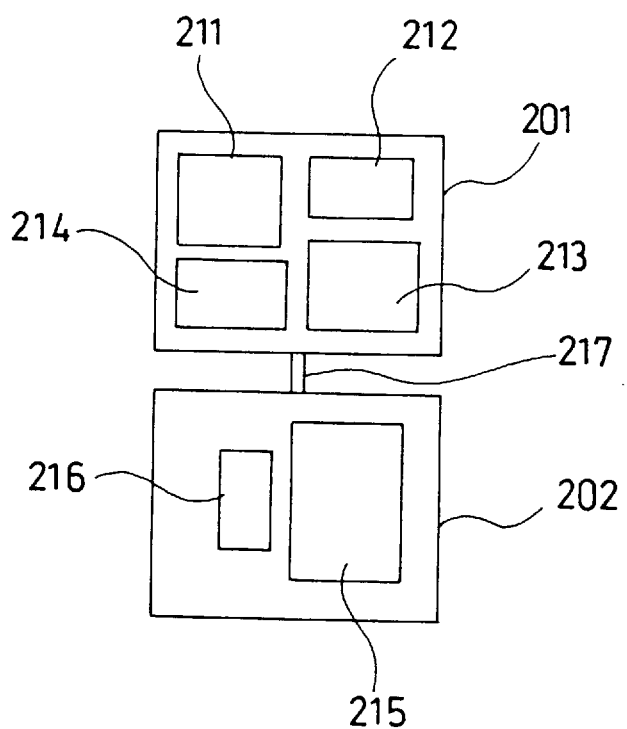
FIG. 7 is a functional block diagram of an OTP microcomputer as a semiconductor device according to a second embodiment.

FIG. 7 shows functional blocks of an OTP microcomputer 200 as a semiconductor device according to a second embodiment. The OTP microcomputer 200 is composed of a microcomputer chip 201 as the first semiconductor chip and an OTP memory chip 202 as the second semiconductor chip. In the microcomputer chip 201, there are formed: a CPU core 211; a peripheral circuit 212; a built-in ROM 213; and a built-in RAM 214. In the OTP chip 202, there are formed: an OTP (UV erasable programmable ROM) 215; and an OTP control circuit 216. The microcomputer chip 201 is connected to the OTP chip 202 by an internal connecting bus 217.

Figure 8:
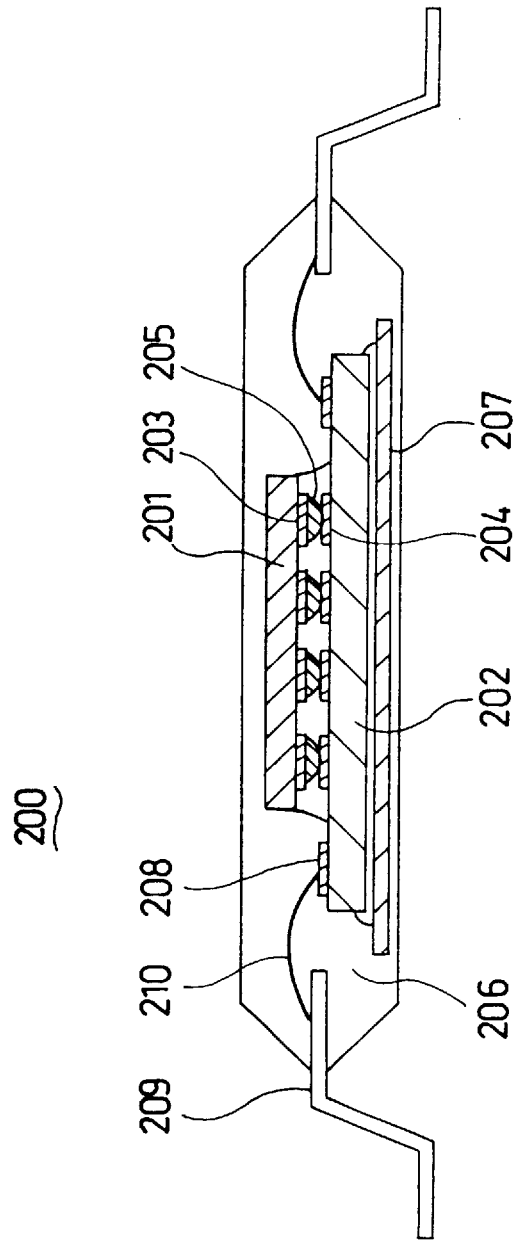
FIG. 8 is a cross-sectional view of the OTP microcomputer in the semiconductor device according to the second embodiment.

FIG. 8 shows the cross-sectional structure of the OTP microcomputer 200 composed of the microcomputer chip 201 and the OTP chip 202, which have been modularized with their respective functional surfaces (formed with semiconductor elements) opposed to each other. First electrode pads 203 formed on the functional surface of the microcomputer chip 201 are electrically connected to second electrode pads 204 formed on the functional surface of the OTP chip 202 with connecting bumps 205 interposed therebetween. The OTP microcomputer 200 composed of the microcomputer chip 201 integrated with the OTP memory chip 202 is die bonded to a die pad 207. The peripheral portion of the OTP memory chip 202 is formed with an electrode 208 for external connection. The OTP microcomputer 200 is hermetically sealed in a QFP by using an insulating resin 206 with the electrode 208 for external connection connected to a leadframe 209 by a bonding wire 210. The packaging allows the resulting OTP microcomputer 200 to be used in the same manner as a typical one-chip OTP microcomputer. The internal connecting bus 217 for connecting the microcomputer chip 201 to the OTP memory chip 202 is physically implemented by the connecting bump 205.

In the OTP microcomputer 200 according to the second embodiment, the microcomputer chip 201 initially developed complies with the final specifications for mass production, resulting in a significant reduction in the number of developing steps.

Figure 9:
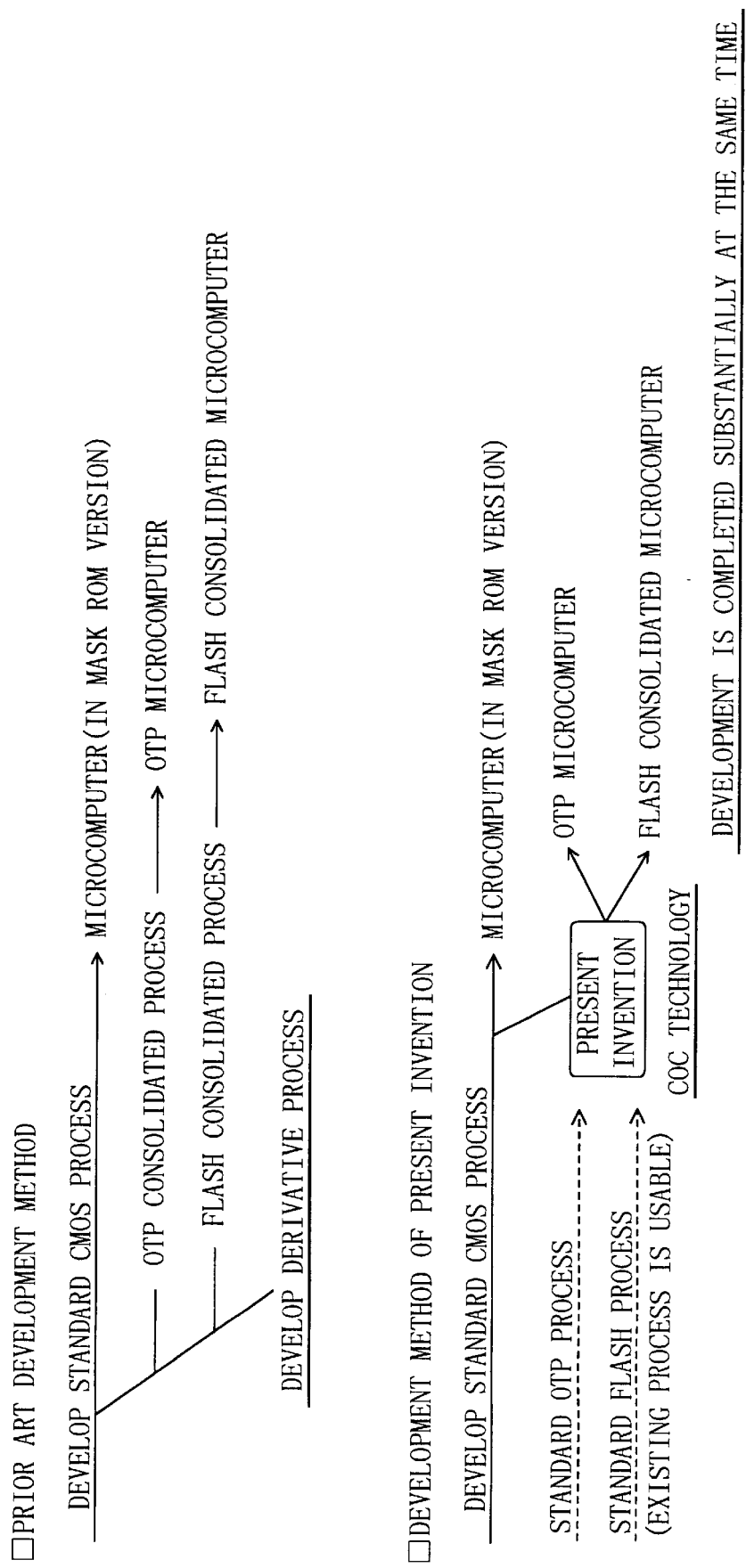
FIG. 9 illustrates for comparison the respective numbers of steps for process development using the OTP microcomputer of the second embodiment and an OTP microcomputer of the second conventional embodiment.

FIG. 9 shows for comparison the number of steps for process development with the OTP microcomputer by the method according to the third conventional embodiment and the number of steps for process development with the OTP microcomputer by the method according to the second embodiment. As is apparent from the foregoing description and the flow of FIG. 9, the third conventional embodiment requires a derivative process for mounting the OTP memory or a flash memory and the CMOS on the same chip, while the first embodiment does not require the derivative process since it can utilize the existing process. Moreover, the third conventional embodiment also requires a derivative process every time the process generation is replaced, while the CMOS fabrication process and the fabrication process for each memory should belong to the same process since it is necessary to use the same design rules because of the CMOS integrated with each memory. On the other hand, the second embodiment does not require a derivative process every time the process generation is replaced, while the CMOS fabrication process and the fabrication process for each memory need not belong to the same generation since it is not necessary to use the same design rules because of the CMOS formed separately from each memory.

In place of the OTP memory chip 202, a non-volatile memory of erasable or writable type, such as a flash memory, can also be used in the second embodiment.

(Third Embodiment)

Figure 10:
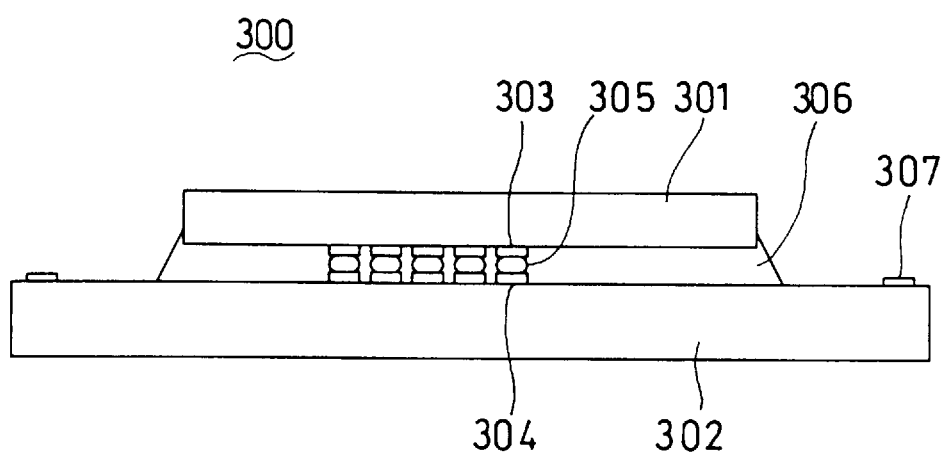
FIG. 10 is a cross-sectional view of a semiconductor device according to a third embodiment.
Figure 11:
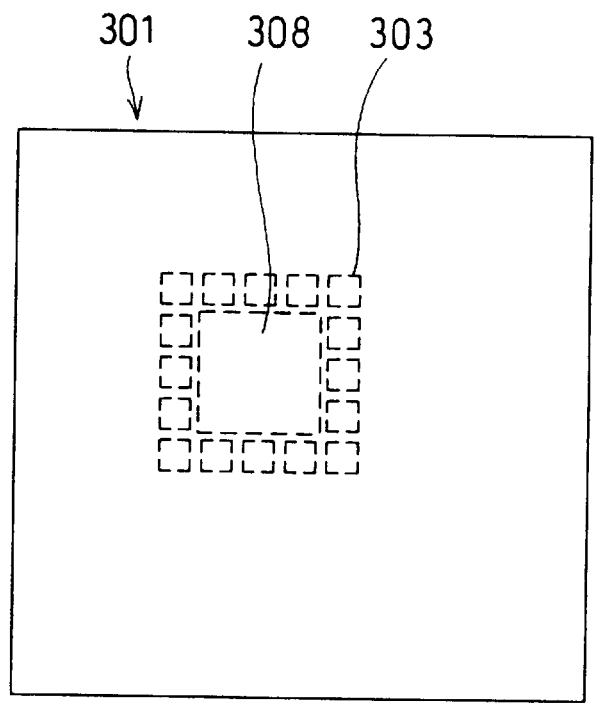
FIG. 11 is a plan view of a first semiconductor chip composing the semiconductor device according to the third embodiment.
Figure 12:
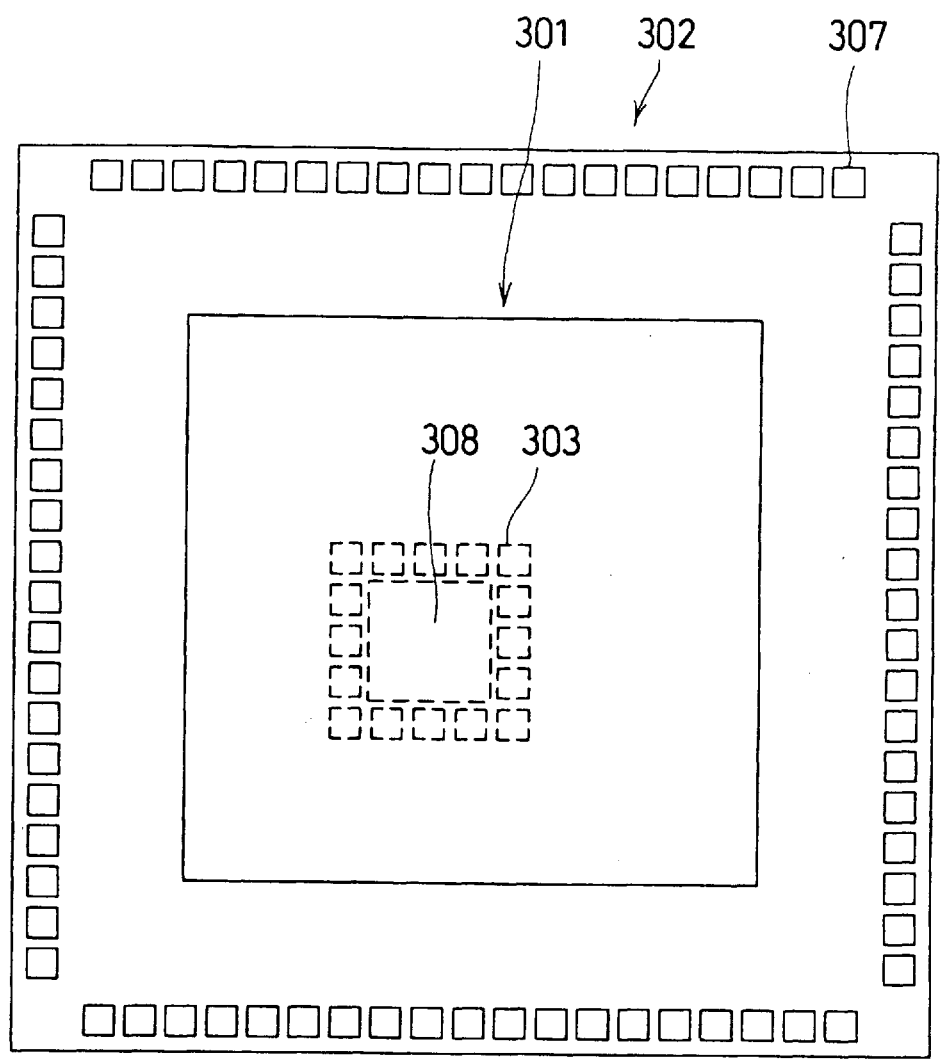
FIG. 12 is a plan view of the semiconductor device according to the third embodiment.

FIG. 10 shows the cross-sectional structure of a semiconductor device 300 according to a third embodiment of the present invention. The semiconductor device 300 is composed of a first semiconductor chip 301 composed of, e.g., a microcomputer chip and a second semiconductor chip 302, which have been modularized with their respective functional surfaces (formed with semiconductor elements) opposed to each other. FIG. 11 shows the plan structure of the first semiconductor chip 301. FIG. 12 shows the plan structure of the second semiconductor chip 302.

As shown in FIG. 10, first area electrode pads 303 formed on the functional surface of the first semiconductor chip 301 are electrically connected to second area electrode pads 304 formed on the functional surface of the second semiconductor chip 302 with connecting bumps 305 interposed therebetween. The first semiconductor chip 301 is secured to the second semiconductor chip 302 by using an insulating resin 306 with the first area electrode pads 303 being connected to the second area electrode pads 304.

As shown in FIGS. 10 and 12, the peripheral portion of the functional surface of the second semiconductor chip 302 is formed with an electrode 307 for external connection. As shown in FIG. 11, a CPU core 308 is formed inside the first semiconductor chip 301 and the first area electrode pads 303 are formed around the CPU core 308 on the functional surface of the first semiconductor chip 301.

Figure 13:
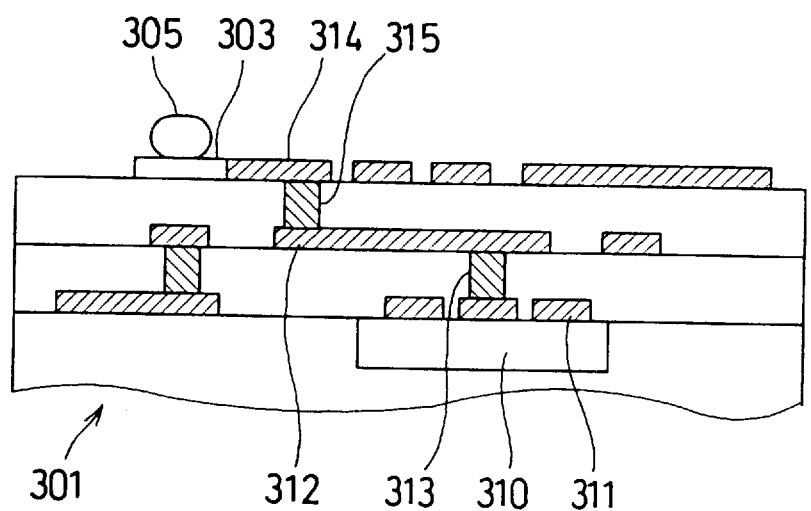
FIG. 13 is a cross-sectional view of the first semiconductor chip composing the semiconductor device according to the third embodiment.

FIG. 13 shows the cross-sectional structure of the first semiconductor chip 301. On a diffused region of a transistor formed in a semiconductor substrate, there is formed a first-layer interconnection 311. The first-layer interconnection 311 is connected to a second-layer interconnection 312 by a first contact 313. The second-layer interconnection 312 is connected to a third-layer interconnection 314 by a second contact 315.

The third embodiment is characterized in that the connecting bumps 305 are formed on the first area electrode pads 303 connected to the third-layer interconnection 314. In short, the first area electrode pads 303 are formed on the same layer as the uppermost one (normally the layer in which a global interconnection is formed between functional blocks) of the interconnection layers composing the functional element.

To form the first area electrode pads 303 and the third-layer interconnection 314 in the same interconnection layer, it is required to miniaturize the first area electrode pads 303 and the connecting bumps 305.

To satisfy the requirement, the third embodiment uses such bump connecting technology as MBB (Micro Bump Bonding) developed by Matsushita Electric Industry Co., Ltd. to implement microbonding with 30-$\mu$m or lower pitches.

Figure 14:
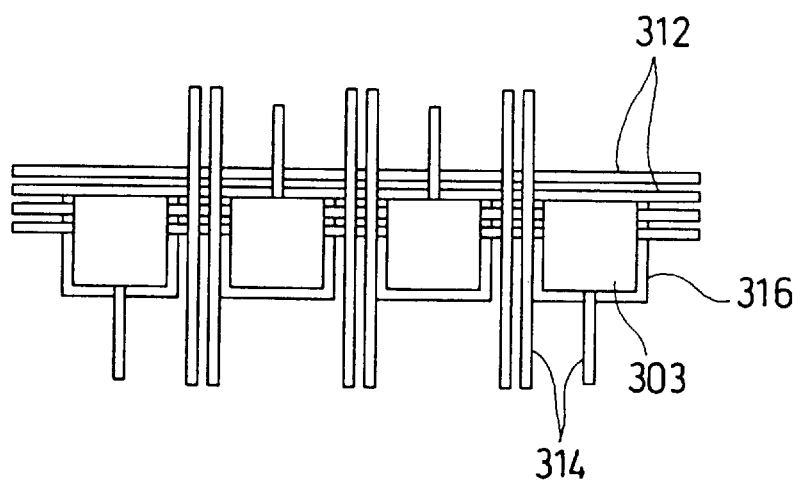
FIG. 14 is a plan view of the first semiconductor chip composing the semiconductor device according to the third embodiment.

FIG. 14 shows the plan structure of the first semiconductor chip 301 in the semiconductor device 300 according to the third embodiment, in which an I/O cell (SCAD) 316 (corresponding to a diffused region 310 of the transistor) is formed below the first area electrode pad 303. As shown in the drawing, by miniaturizing the first area electrode pads 303, it becomes possible to form the third-layer interconnection 314 between the adjacent first area electrode pads 303. If it is assumed that the first area electrode pads 303 are 20 $\mu$m square and have 30-$\mu$m pitches, the space between the pads becomes 10 $\mu$m, which is sufficient to form the third-layer interconnection 314 with a submicron width equal to or less than 1 $\mu$m between the adjacent first area electrode pads 303.

Moreover, if a low-load connection process involving a load having a specified value or less is used in connecting the first area electrode pads 303 of the first semiconductor chip 301 and the second area electrode pads 304 of the second semiconductor chip 302 with the connecting bumps 305 interposed therebetween, the first-layer and second-layer interconnections 311 and 312, the first and second contacts 313 and 315, and the diffused region 310 of the transistor, each of which is formed below the first area electrode pads 303, remain unaffected. In this case, the connecting bump 305 is preferably composed of a soft metal such as In.

As described above, the architecture of the third embodiment wherein the first area electrode pads 303 are connected to the uppermost-layer interconnection 314 with no contact interposed therebetween enables the first area electrode pads 303 and the third-layer interconnection 314 to be formed in the same interconnection layer, so that wiring routed for the first area electrodes 303 becomes unnecessary. Accordingly, the process cost of one layer for routed wiring, which has conventionally been required, becomes unnecessary and the lowering of production yield accompanying an increased number of interconnection layers can be prevented, resulting in reduced final chip cost. Moreover, since the wiring routed from the input/output point in the functional element to the electrode pad layer becomes unnecessary, the load resistance of the routed wiring is prevented from interrupting high-speed operation.

(Fourth Embodiment)

Figure 15:
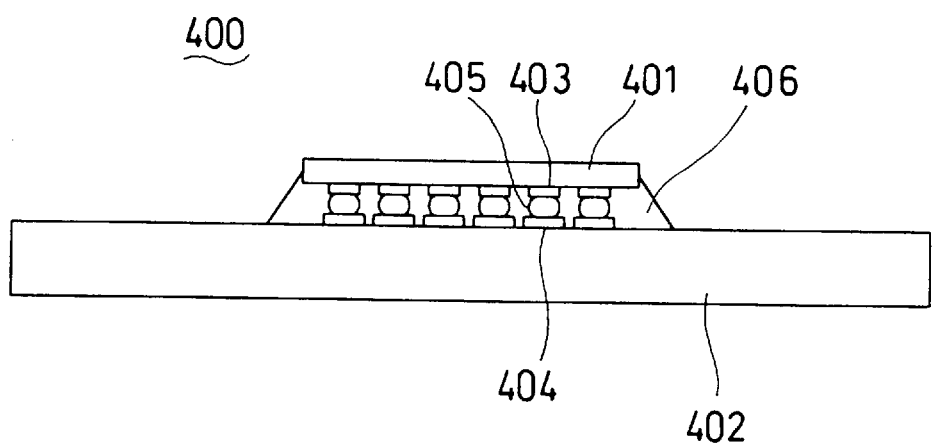
FIG. 15 is a cross-sectional view of a semiconductor device according to a fourth embodiment.

FIG. 15 shows the cross-sectional structure of a semiconductor device 400 according to a fourth embodiment of the present invention. The semiconductor device 400 is composed of a first semiconductor chip 401 composed of, e.g., a microcomputer chip and a second semiconductor chip 402, which have been modularized with their respective functional surfaces (formed with semiconductor elements) opposed to each other.

As shown in FIG. 15, first area electrode pads 403 formed on the functional surface of the first semiconductor chip 401 are electrically connected to second area electrode pads 404 formed on the functional surface of the second semiconductor chip 402 with connecting bumps 405 interposed therebetween. The first semiconductor chip 401 is secured to the second semiconductor chip 402 by using an insulating resin 406 with the first area electrode pads 403 being connected to the second area electrode pads 404.

Figure 16:
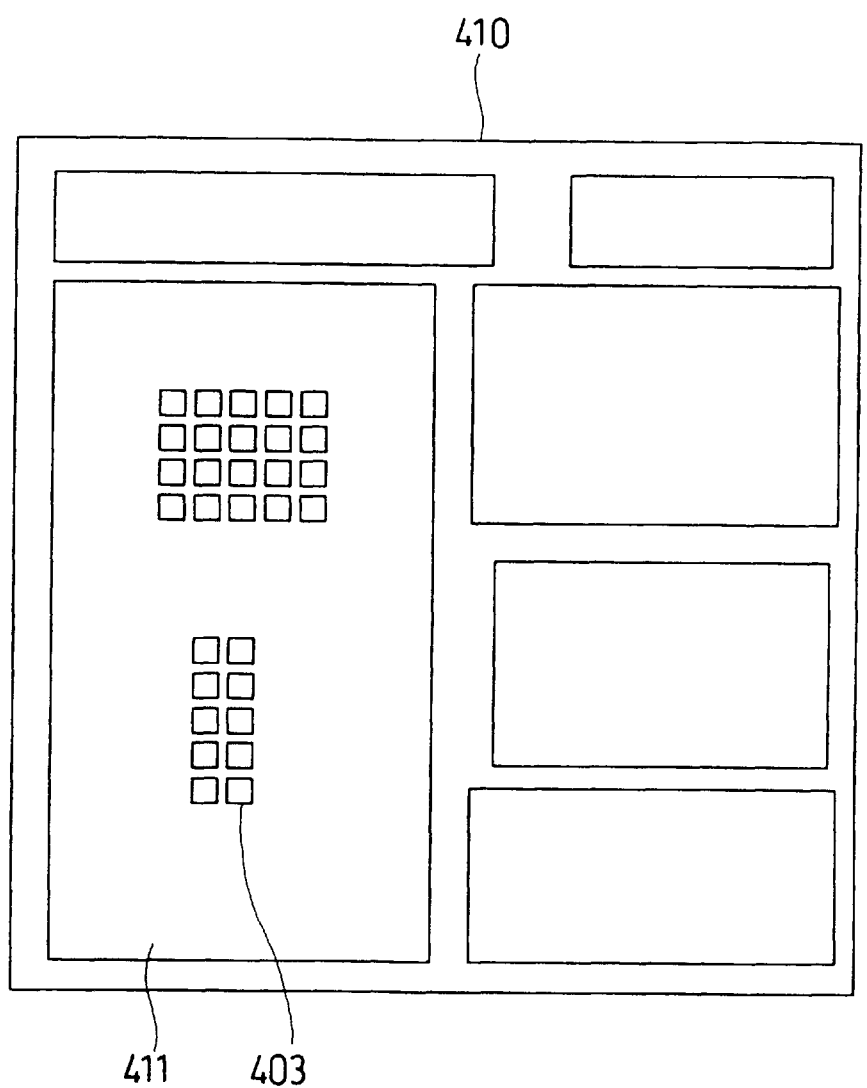
FIG. 16 is a plan view of a first semiconductor chip composing the semiconductor device according to the fourth embodiment.

FIG. 16 partially illustrates the plan structure of a functional block of the first semiconductor chip 401, in which are shown: a functional block 410 such as a CPU core formed on the functional surface of the first semiconductor chip 401; and a data path element 411 formed in the CPU core 410. The first area electrode pads 403 are formed in the internal region of the data path element 411. The first area electrode pads 403 disposed in the internal region of the data path element 411 allow a signal to be outputted or inputted from and to a desired point. As a result, undesired influence of a wiring delay can be reduced and higher-speed signal transmission is achieved, which enables the CPU core 410 to operate at a higher speed.

Figure 17:
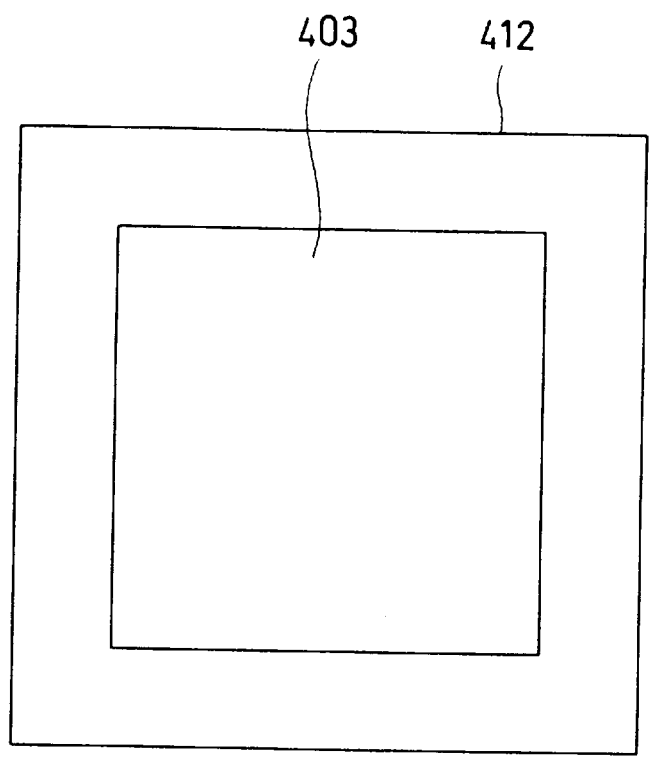
FIG. 17 is a plan view of a first area electrode pad of the first semiconductor chip composing the semiconductor device according to the fourth embodiment.

FIG. 17 is an enlarged view of the first area electrode pad 403, in which is shown an I/O cell 412 or a so-called SCAD circuit of the first area electrode pad 403. The first area electrode pad 403 thus disposed on the SCAD circuit 412 apparently occupies no area. Moreover, the first area electrode pad 403 registered as an on-cell pad in a design library improves a designing efficiency.

(Fifth Embodiment)

Figure 18:
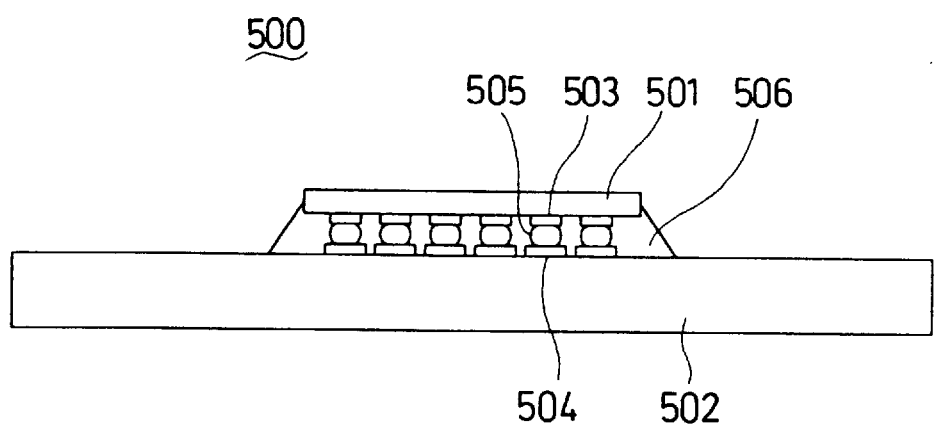
FIG. 18 is a cross-sectional view of a semiconductor device according to a fifth embodiment.

FIG. 18 shows the cross-sectional structure of a semiconductor device 500 according to a fifth embodiment of the present invention. The semiconductor device 500 is composed of a first semiconductor chip 501 and a circuit board 502 which have been modularized. In the fifth embodiment, the semiconductor chip 501 is mounted on the circuit board 502 by so-called flip-chip bonding.

The circuit board 502 is composed of a typical resin substrate (printed circuit board), a ceramic multilayer substrate, a glass substrate, or the like.

As shown in FIG. 18, area electrode pads 503 formed on the functional surface of the semiconductor chip 501 are electrically connected to electrode pads 504 formed on the circuit board 502 with connecting bumps 505 interposed therebetween. The semiconductor chip 501 is secured to the circuit board 502 by using an insulating resin 506 with the area electrode pads 503 being connected to the electrode pads 504.

In the fifth embodiment also, the area electrode pads 503 are preferably composed of area-type pads disposed inside the semiconductor chip 501 rather than peripheral-type pads, thereby facilitating the provision of an increasing number of pins.

We claim:

1. A semiconductor device comprising:
  a first semiconductor chip formed with a first functional element; and
  a second semiconductor chip formed with a second functional element, wherein
  said first and second semiconductor chips are disposed with respective functional surfaces formed with said first and second functional elements being opposed to each other,
  first electrode pads of said first semiconductor chip are electrically connected to second electrode pads of said second semiconductor chip with bumps interposed therebetween, and
  each of said first electrode pads is formed between two interconnecting wires on an uppermost one of plural interconnection layers composing circuitry of said first functional element.

2. A semiconductor device according to claim 1, wherein said first electrode pads are formed on a peripheral region of a functional block composing said first functional element so as to transmit signals between said functional block and the outside of said first semiconductor chip.

3. A semiconductor device according to claim 2, wherein said first semiconductor chip is a microcomputer chip and said functional block is a CPU core.

4. A semiconductor device according to claim 1, wherein said first electrode pads are formed on an internal region of a functional block composing said first functional element so as to transmit signals between said functional block and the outside of said first semiconductor chip.

5. A semiconductor device according to claim 4, wherein said first semiconductor chip is a microcomputer chip and said functional block is a CPU core.

6. A semiconductor device according to claim 1, wherein each of said first electrode pads is formed above a signal input/output circuit element composing said first functional element.

7. A semiconductor device according to claim 1, wherein said first semiconductor chip is a microcomputer chip having a CPU core, a peripheral circuit, and a built-in RAM and not having an emulation functional element and said second semiconductor chip has the emulation functional element.

8. A semiconductor device according to claim 1, wherein
said first semiconductor chip is a microcomputer chip having a CPU core, a peripheral circuit, and a built-in RAM and not having a non-volatile memory of erasable or writable type and
said second semiconductor chip has the non-volatile memory of erasable or writable type.

9. A semiconductor device comprising:
a semiconductor chip formed with a functional element; and
a circuit board with said semiconductor chip mounted thereon by face-down bonding, wherein
first electrode pads of said semiconductor chip are electrically connected to second electrode pads of said circuit board with bumps interposed therebetween and
each of said first electrode pads is formed between two interconnecting wires on an uppermost one of interconnection layers composing circuitry of said functional element.

10. A semiconductor device according to claim 9, wherein
said first electrode pads are formed on a peripheral region of a functional block composing said functional element so as to transmit signals between said functional block and the outside of said first semiconductor chip.

11. A semiconductor device according to claim 10, wherein
said first semiconductor chip is a microcomputer chip and said functional block is a CPU core.

12. A semiconductor device according to claim 9, wherein
said first electrode pads are formed on an internal region of a functional block composing said first functional element so as to transmit signals between said functional block and the outside of said first semiconductor chip.

13. A semiconductor device according to claim 12, wherein
said first semiconductor chip is a microcomputer chip and said functional block is a CPU core.

14. A semiconductor device according to claim 9, wherein each of said first electrode pads is formed above a signal input/output circuit element composing said first functional element.

* * * * *